US005384853A

United States Patent [19]

Kinoshita et al.

[11] Patent Number: 5,384,853

[45] Date of Patent: Jan. 24, 1995

[54] ACTIVE NOISE REDUCTION APPARATUS

[75] Inventors: Akio Kinoshita, Fujisawa; Kazuhiro Doi; Kenichiro Muraoka, both of Yokohama; Isutomu Hamabe, Yokosuka, all of Japan

[73] Assignee: Nissan Motor Co., Ltd., Yokohama, Japan

[21] Appl. No.: 33,748

[22] Filed: Mar. 18, 1993

[30] Foreign Application Priority Data

Mar. 19, 1992 [JP] Japan ................................ 4-064013

[51] Int. Cl.[6] ........................................ H03B 29/00

[52] U.S. Cl. ........................................ 381/71; 381/94

[58] Field of Search ................................ 381/71, 94

[56] References Cited

U.S. PATENT DOCUMENTS 4,677,676 6/1987 Eriksson ................................ 381/71

5,216,722 6/1993 Popovich ................................ 381/71

FOREIGN PATENT DOCUMENTS 3-259722 11/1991 Japan .

2149614A 6/1985 United Kingdom .

OTHER PUBLICATIONS

"A Multiple Error LMS Algorithm and Its Application to the Active Control of Sound and Vibration", by Stephen J. Elliott et al, IEEE Transactions on Acoustics, Speech, and Signal Processing, vol. ASSP-35, No. 10, Oct. 1987, pp. 1423-1434.

"Adaptive Noise Cancelling: Principles and Applications", by Bernard Widrow et al, Proceedings of the IEEE, vol. 63, No. 12, Dec. 1975, pp. 1692-1716.

*Primary Examiner*—Curtis Kuntz

*Assistant Examiner*—Mark D. Kelly

*Attorney, Agent, or Firm*—Lowe, Price, LeBlanc & Becker

[57] ABSTRACT

An apparatus for active reduction of noises transmitted from a noise source into a space. The active noise reduction apparatus comprises residual noise sensors for detecting the residual noises in the space. A reference signal is produced based upon the noise generating condition of the noise source. The reference signal is used, along with the detected residual noises, to drive control sound sources so as to reduce the noises in the space. A filter is adjusted to correspond to acoustic transfer characteristics between the control sound sources and the residual noise sensors. An identification sound is generated to correspond to the background noise level detected in the space and to the spectral distribution of the noises transmitted into the space. The coefficients of the filter are updated according to acoustic transfer characteristics between the control sound sources and the residual noise sensors. The acoustic transfer characteristics are obtained based upon the identification sound and the residual noises.

42 Claims, 10 Drawing Sheets

ACTIVE NOISE REDUCTION APPARATUS

BACKGROUND OF THE INVENTION

This invention relates to an apparatus for active reduction of noises transmitted into a space from noise sources by producing control sounds for interference with the transmitted noises.

For example, British Patent No. 2,149,614 discloses a conventional active noise reduction apparatus for use in airplane passenger compartments or other closed spaces. The conventional active noise reduction apparatus is applicable to reduce noises transmitted from a single source of noises having a fundamental frequency $f_0$ and its higher harmonics $f_1$ to $f_n$. The noise source is an engine or the like placed in the exterior of the closed space. A plurality of microphones are placed at different positions within the closed space for detecting the sound pressures applied thereon. In order to produce control sounds for interference with the transmitted noises, a plurality of loudspeakers are placed at different positions within the closed space. The loudspeakers are driven by drive signals having frequencies in opposite phase to the frequencies $f_0$ to $f_n$ of the transmitted noises to cancel the transmitted noises. A "WIDROW LMS" algorithm developed for multiple channels is used to drive the loudspeakers. The "WIDROW LMS" algorithm is described in an article published 1975, in PROCEEDINGS OF THE IEEE. Vol. 63, page 1692, entitled "Adaptive Noise Cancellation: Principles and Applications". The "WIDROW LMS" algorithm developed for multiple channels is described in an article published 1987, in IEEE TRANS. ACOUST., SPEECH, SINGLE PROCESSING, VOL. ASSP-35, PP. 1423–1434 entitled "A MULTIPLE ERROR LMS ALGORITHM AND ITS APPLICATION TO THE ACTIVE CONTROL OF SOUND AND VIBRATION".

The LMS (least mean square) algorithm is one of a number of appropriate algorithms for use in updating the filter coefficients of adaptive digital filters. For example, in a so-called Filtered-X LMS algorithm, all of the transfer function filters modeled on the transfer functions between the loudspeakers and the microphones are set for all of the loudspeaker-microphone combinations. The filter coefficient of each of the variable filter coefficient digital filters provided for the respective loudspeakers is updated in a manner to reduce the value of the performance function calculated based upon the residual noise levels detected by the respective microphones.

The conventional active noise reduction apparatus is designed on such an assumption that the filter accurately represents the acoustic transfer characteristic between the loudspeaker and the microphone. It is, therefore, impossible to reduce the noises if there is a great difference between the acoustic transfer characteristic represents by the filter and the acoustic transfer characteristic of the actual physical space.

Japanese Patent Kokai No. 3-259722 discloses another active noise reduction apparatus applied to a refrigerator. The active noise reduction apparatus employs a microphone to measure the sound pressure at a predetermined position within the refrigerator and a loudspeaker to produce a control sound so as to cancel the noises produced from the compressor used in the refrigerator before the noises are emitted through the duct to the exterior. The control sound is produced based upon the operating condition of the compressor. Each time the compressor comes to a stop, an identification sound is produced to measure an acoustic transfer characteristic between the loudspeaker and the microphones. The measured acoustic transfer characteristic is utilized to identify the filter. However, this conventional active noise reduction apparatus cannot be applied directly to a vehicle passenger compartment since the passenger will be put to great annoyance by the identification sound. In addition, the temperature and humidity change in a short time to a great extent in the vehicle passenger compartment. This causes a deviation of the acoustic transfer characteristic represented by the filter from the actual acoustic transfer characteristic of the actual physical space even though the filter coefficient is updated each time the engine comes to a stop. The deviation will increase with time.

SUMMARY OF THE INVENTION

It is a main object of the invention to provide an improved active noise reduction apparatus which can maintain good noise control over a long period of time without annoying the man or woman in the space to be controlled.

There is provided, in accordance with the invention, an apparatus for active reduction of noises transmitted from a noise source into a space. The active noise reduction apparatus comprises control sound sources for producing control sounds in the space, residual noise detecting means for detecting residual noises at predetermined positions in the space, noise generating condition detecting means for detecting a noise generating condition of the noise source to generate a reference signal, signal processing means for filtering the reference signal corresponding to an acoustic transfer function between the control sound sources and the residual noise detecting means, active control means for driving the control sound sources to reduce the noises in the space based upon the reference signal and the residual noises, background noise level detecting means for detecting a background noise level in the space, identification sound generating means for producing an identification sound corresponding to the detected background noise level in the space, and updating means for obtaining acoustic transfer characteristics between the control sound sources and the residual noise detecting means based upon the identification sound and the residual noises to update a content of the signal process of the signal processing means.

In another aspect of the invention, there is provided an apparatus for active reduction of noises transmitted from a noise source into a space. The active noise reduction apparatus comprises control sound sources for producing control sounds in the space, residual noise detecting means for detecting residual noises at predetermined positions in the space, noise generating condition detecting means for detecting a noise generating condition of the noise source to generate a reference signal, signal generating means for generating drive signals to drive the control sound sources based upon the reference signal, signal processing means for filtering the reference signal corresponding to an acoustic transfer between the control sound sources and the residual noise detecting means, control means for adjusting a content of the process of the signal generating means based upon a value resulting from the reference signal processed in the signal processing means to reduce the noises in the space, identification signal generating means for generating an identification signal having a spectral distribution similar to a spectral distribution of the noises transmitted from the noise source, background noise level detecting means for detecting a background noise level in the space, gain adjusting means for adjusting a gain of the identification signal based upon the detected background noise level, signal superimposing means for superimposing the identification signal having the adjusted gain on the drive signals generated from the signal generating means to produce signals to the control sound sources, and updating means for obtaining acoustic transfer characteristics between the control sound sources and the residual noise detecting means based upon the identification signal having the adjusted gain and the residual noises in the space when the control sound sources are driven by the signals produced from the signal superimposing means to update a content of the signal process of the signal processing means.

In still another aspect of the invention, there is provided an apparatus for active reduction of noises transmitted from a noise source into a vehicle passenger compartment. The active noise reduction apparatus comprises control sound sources for producing control sounds in the vehicle passenger compartment, residual noise detecting means for detecting residual noises at predetermined positions in the vehicle passenger compartment, noise generating condition detecting means for detecting a noise generating condition of the noise source to generate a reference signal, signal processing means for filtering the reference signal corresponding to acoustic transfer characteristics between the control sound sources and the residual noise detecting means, active control means for driving the control sound sources to reduce the noises in the vehicle passenger compartment based upon the reference signal and the residual noises, background noise level detecting means for detecting a background noise level in the vehicle passenger compartment, identification sound generating means for producing an identification sound corresponding to the detected background noise level in the vehicle passenger compartment, and updating means for obtaining acoustic transfer characteristics between the control sound sources and the residual noise detecting means based upon the identification sound and the residual noises to update a content of the signal process of the signal processing means.

In still another aspect of the invention, there is provided an apparatus for active reduction of noises transmitted from a noise source into a vehicle passenger compartment. The active noise reduction apparatus comprises control sound sources for producing control sounds in the vehicle passenger compartment where noises are transmitted from noise sources in the vicinity of vehicle road wheels, residual noise detecting means for detecting residual noises at predetermined positions in the vehicle passenger compartment, noise generating condition detecting means for detecting a noise generating condition of the noise source to generate a reference signal, signal generating means for generating drive signals to drive the control sound sources based upon the reference signal, signal processing means for filtering the reference signal corresponding to acoustic transfer characteristics between the control sound sources and the residual noise detecting means, control means for adjusting a content of the process of the signal generating means based upon a value resulting from the reference signal processed in the signal processing means to reduce the noises in the vehicle passenger compartment, identification signal generating means for generating an identification signal having a spectral distribution exhibiting a smaller level on a higher frequency side, background noise level detecting means for detecting a background noise level in the vehicle passenger compartment, gain adjusting means for adjusting a gain of the identification signal based upon the detected background noise level, signal superimposing means for superimposing the identification signal having the adjusted gain on the drive signals generated from the signal generating means to produce signals to the control sound sources, and updating means for obtaining acoustic transfer characteristics between the control sound sources and the residual noise detecting means based upon the identification signal having the adjusted gain and the residual noises in the vehicle passenger compartment when the control sound sources are driven by the signals produced from the signal superimposing means to update a content of the signal process of the signal processing means.

BRIEF DESCRIPTION OF THE DRAWINGS

This invention will be described in greater detail by reference to the following description taken in connection with the accompanying drawings, in which:

FIG. 3(*b*) is a graph showing the spectral distribution of the signal output from the M series signal generator of the identification signal generating section;

FIG. 3(*c*) is a graph showing the spectral distribution of the identification signal output from the low pass filter of the identification signal generating section;

FIG. 4(*b*) is a graph of gain versus rms value;

DETAILED DESCRIPTION OF THE INVENTION

Figure 1:
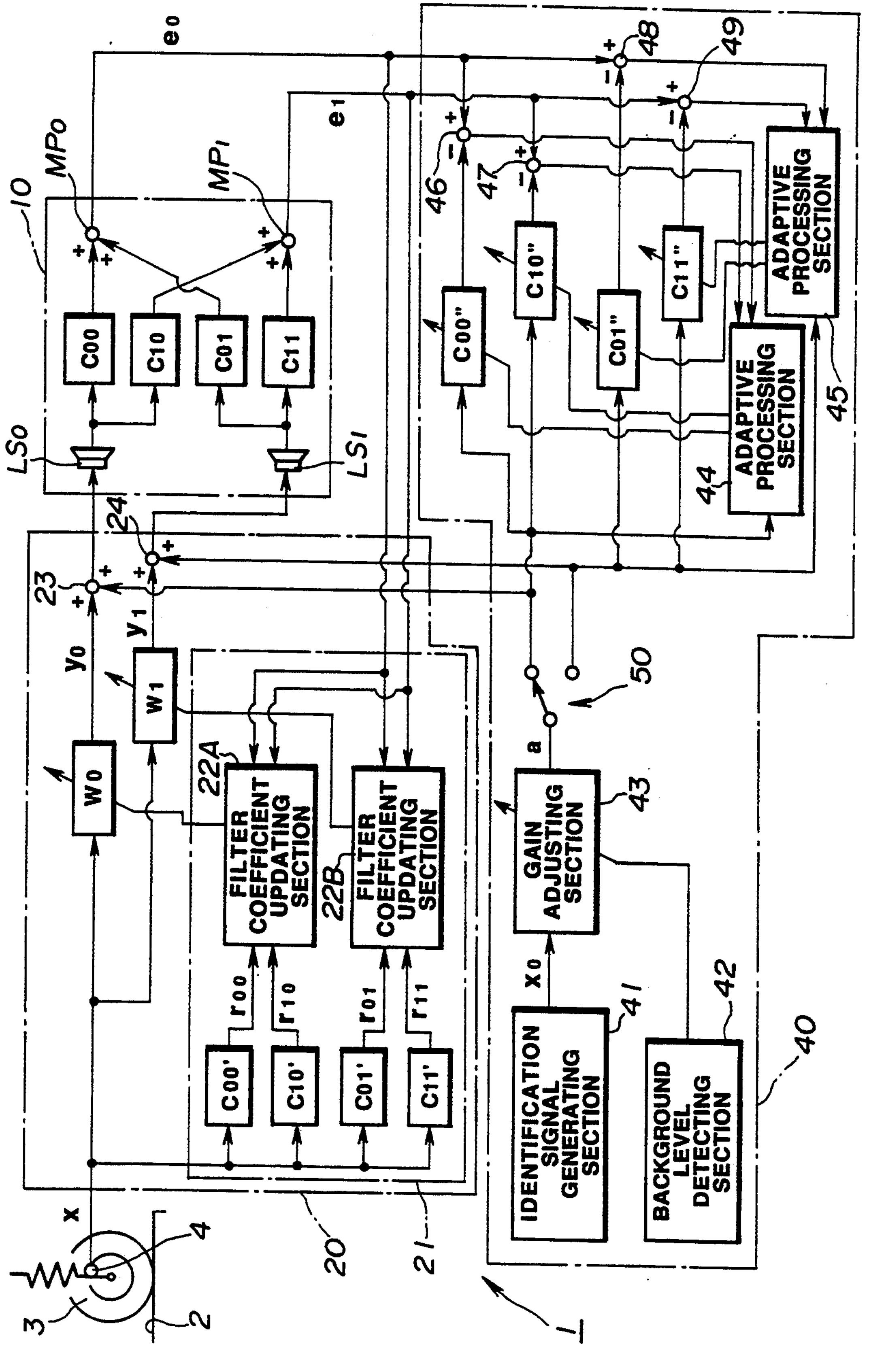
FIG. 1 is a schematic block diagram showing one embodiment of an active noise reduction apparatus made in accordance with the invention.

With reference to the drawings, and in particular to FIG. 1, there is shown an active noise reduction apparatus embodying the invention. The invention will be described in connection with an automotive vehicle 1 supported on front- and rear-road wheels 3 placed on a road surface 2. The automotive vehicle 1 has a passenger compartment (closed space) 10 into which road noises are transmitted from road noise sources. The active noise reduction apparatus includes noise generating condition detecting means in the form of a vibration sensor 4 positioned for sensing the road noise source information produced in the vicinity of the road wheel 3, a main control section 20 including active control means for performing adaptive controls based upon a reference signal x indicative of the vibrations sensed in the vicinity of the road wheel 3, control sound sources in the form of loudspeakers $LS_0$ and $LS_1$ placed in the vehicle passenger compartment 10, residual noise detecting means in the form of microphones $MP_0$ and $MP_1$, signal processing means in the form of filters $C_{00}'$, $C_{10}'$, $C_{01}'$ and $C_{11}'$ provided in the main control section 20, and identification processing section 40 of identifying the filters $C_{00}'$, $C_{10}'$, $C_{01}'$ and $C_{11}'$.

The main control section 20 includes signal generating means in the form of adaptive digital filters $W_0$ and $W_1$ for generating drive signals $y_0$ and $y_1$ to drive the loudspeakers $LS_0$ and $LS_1$, and an adaptive processing section 21 for updating the filter coefficients of the adaptive digital filters $W_0$ and $W_1$ based upon the reference signal x produced from the vibration sensor 4 and the residual noise signals $e_0$ and $e_1$ outputted from the microphones $MP_0$ and $MP_1$. The adaptive processing section 21 is arranged to execute a so-called Multiple Error Filtered-X LMS algorithm. For this purpose, the adaptive processing section 21 includes filters $C_{00}'$, $C_{10}'$, $C_{01}'$ and $C_{11}'$ modeled in the form of finite impulse response functions on the acoustic transfer characteristics (transfer functions $C_{00}$, $C_{10}$, $C_{01}$ and $C_{11}$) between the loudspeakers $LS_0$ and $LS_1$ and the microphones $MP_0$ and $MP_1$, and control means in the form of filter coefficient updating sections 22A and 22B for updating the filter coefficients of the adaptive digital filters $W_0$ and $W_1$ to minimize the noises in the vehicle passenger compartment 10 based upon the values $r_{00}$, $r_{10}$, $r_{01}$ and $r_{11}$ to which the reference signal x is processed by the filters $C_{00}'$, $C_{10}'$, $C_{01}'$ and $C_{11}'$ and the residual noise signals $e_0$ and $e_1$.

Assuming now that $e_l(n)$ is the residual noise signal detected by the l-th microphone (l=0, 1, . . . , L where L=1 in this embodiment), $ep_l(n)$ is the residual noise signal detected by the l-th microphone with no control sound produced from the loudspeakers, $C_{lmj}'$ is the j-th filter coefficient (j=0, 1, 2, . . . , Ic−1 where Ic is a constant) of the filter $C_{lm}'$ modeled in the form of a finite impulse response function on the transfer function $C_{lm}$ between the m-th loudspeaker (m=0, 1, . . . , M where M=1 in this embodiment) and the l-th microphone, x(n) is the reference signal, $W_{mi}$ is the i-th filter coefficient (i=0, 1, 2, . . . , Ik−1 where Ik is a constant) of the adaptive digital filter which drives the m-th loudspeaker in response to the reference signal x(n), the following equation is established:

$$e_l(n) = ep_l(n) + \sum_{m=0}^{m} \sum_{j=0}^{Ic-1} C_{lmj}' \left[ \sum_{i=0}^{Ik-1} W_{mi}x(n-j-i) \right] \quad (1)$$

where the terms affixed to (n) indicate the values sampled at a sampling time n, Ic is the number of taps of the filter $C_{lm}'$, and Ik is the number of taps of the adaptive digital filter $W_m$. The term "$\Sigma W_{mi}x(n-j-i)$" on the right side of the above equation indicates the output $y_m(n)$ when the reference signal x(n) is inputted to the adaptive digital filter, the term "$\Sigma C_{lmj}'[\Sigma W_{mi}x(n-j-i)]$" indicates the signal arriving at the l-th microphone through the transfer function $C_{lm}$ when the m-th loudspeaker is driven by the drive signal $y_m(n)$ to produce a control sound, and the term "$\Sigma\Sigma C_{lmj}'[\Sigma W_{mi}x(n-j-i)]$" indicates the sum of the control sounds arriving at the l-th microphone.

It is now assumed that the performance function Je is given as:

$$Je = \sum_{l=0}^{L} [e_l(n)]^2 \quad (2)$$

A least mean square (LMS) algorithm is used to calculate the filter coefficients $W_{mi}$ for which the performance function is at minimum. In more detail, the performance function Je is partially differentiated with respect to the filter coefficients $W_{mi}$. The partially differentiated value is used to update the filter coefficients $W_{mi}$. From Equation (2), $$\partial Je/\partial W_{mi} = \sum_{l=0}^{L} 2e_l(n)\partial e_l(n)/\partial W_{mi} \quad (3)$$

From Equation (1), $$\partial e_l(n)/\partial W_{mi} = \sum_{j=0}^{Ic-1} C_{lmj}'x(n-j-i) \quad (4)$$

Replacing the right side of Equation (4) with $r_{lm}(n-i)$, the filter coefficient as updated with the weight coefficient $\gamma_l$ is given as:

$$W_{mi}(n+1) = W_{mi}(n) + \alpha \sum_{l=0}^{L} \gamma_l e_l(n) r_{lm}(n-i) \quad (5)$$

where α is the convergence coefficient that takes part in the rate at which the filter converges in an optimum fashion and contributes to the stability of the optimum convergence of the filter. The filter coefficient updating sections 22A and 22B update the filter coefficients of the adaptive digital filters $W_0$ and $W_1$ according to Equation (5).

The identification processing section 40 includes identification signal generating means in the form of an identification signal generating section 41 for generating an identification signal $x_0$ used in producing an identification sound, background noise level detecting means in the form of a background noise level detecting section 42 for detecting the level of the background noise in the vehicle passenger compartment, gain adjusting means in the form of a gain adjusting section 43 for adjusting the gain of the identification signal $x_0$ according to the result of the detection made in the background noise level detecting section 42 to output a gain adjusted identification signal $a(=G\cdot x_0)$, variable filter coefficient filters $C_{00}''$, $C_{10}''$, $C_{01}''$ and $C_{11}''$ having the same tap length as the filters $C_{00}'$, $C_{10}'$, $C_{01}'$ and $C_{11}'$ set in the adaptive processing section 21 of the main control section 20, adaptive processing sections 44 and 45 for performing adaptive processing in a manner to bring the filters $C_{00}''$, $C_{10}''$, $C_{01}''$ and $C_{11}''$ into conformance with the actual transfer functions $C_{00}$, $C_{10}$, $C_{01}$ and $C_{11}$ so as to update the filter coefficients of the filters $C_{00}''$, $C_{10}''$, $C_{01}''$ and $C_{11}''$, and subtractors 46, 47, 48 and 49 for subtracting the values resulting from the processes of the identification signal a in the filters $C_{00}''$, $C_{10}''$, $C_{01}''$ and $C_{11}''$ from the residual noises $e_0$ and $e_1$ and applying the resulting differences to the corresponding adaptive processing sections 44 and 45. The identification signal a is also supplied to the main control section 20 where superimposing means in the form of adders 23 and 24 add the identification signal to the signal $y_0$ and $y_1$. The added signals are supplied to drive the loudspeakers $LS_0$ and $LS_1$. Therefore, the loudspeakers $LS_0$ and $LS_1$ produce control sounds corresponding to the signals $y_0$ and $y_1$ along with an identification sound corresponding to the identification signal a. If both of the loudspeakers $LS_0$ and $LS_1$ produce identification sounds, the identification process would be made in order since the identification signal a is of one kind. In this embodiment, a switching section 50 is provided to supply the identification signal a to only one of the adders 23 and 24. The identification signal a is also supplied through the switching section 50 to two of the filters $C_{00}''$, $C_{10}''$, $C_{01}''$, $C_{11}''$ and to one of the adaptive processing sections 44 and 45 corresponding to the loudspeakers $LS_0$ or $LS_1$ from which the identification sound is produced.

Figure 2:
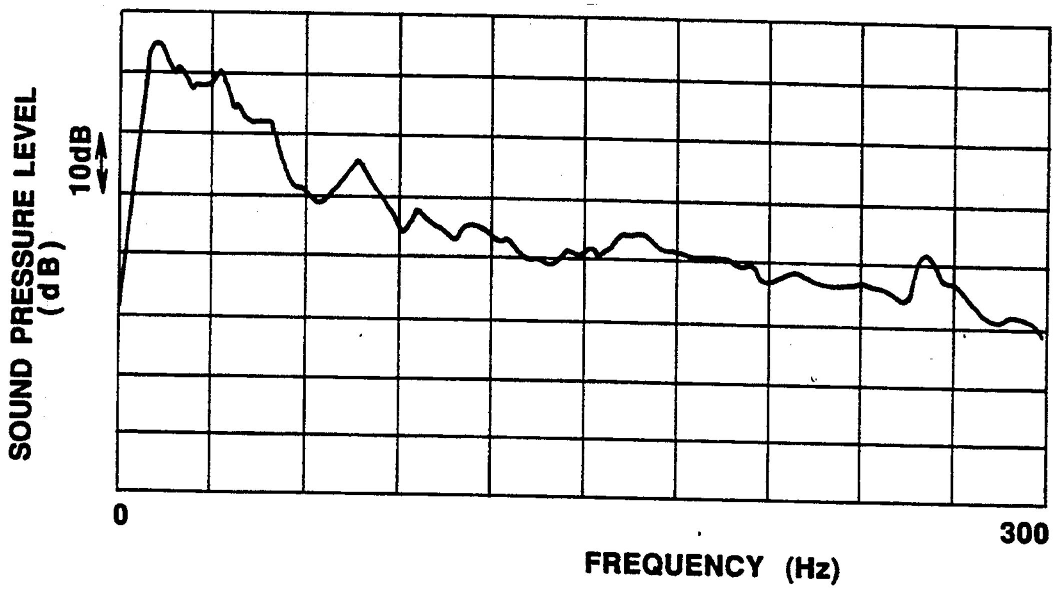
FIG. 2 is a graph of sound pressure versus frequency.

The identification signal $x_0$ generated from the identification signal generating section 41 exhibits a spectral distribution similar to that of the road noises transmitted from the road surface 2 and the road wheel 3. The road noises occur when the road wheel 3 passes the uneven road surface 2. The shape of the spectrum of the uneven road surface is substantially the same for general road surfaces. For this reason, it may be considered that the spectrum shape is dependent on the kind of the vehicle. From macro-standpoints, the spectrum shape exhibits a sound pressure level decreasing as the frequency increases, as shown in FIG. 2. Assuming now that the identification signal $x_0$ produced from the identification signal generating section 41 exhibits such a spectral distribution that it is attenuated at a gradient ranging from −10 dB/octave to −15 dB/octave, the identification signal can be produced in a form of a signal exhibiting a spectral distribution similar to that of the road noises.

Figure 3:
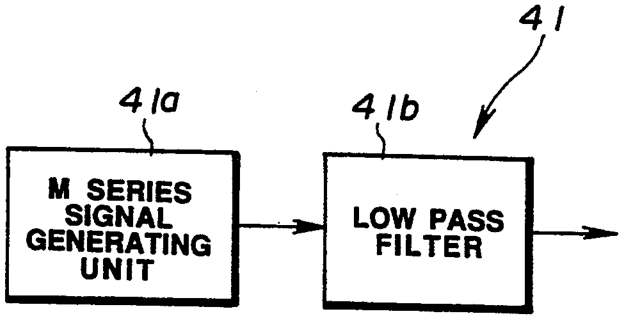
FIG. 3(*a*) is a block diagram showing the detailed arrangement of the identification signal generating section.
Figure 3:
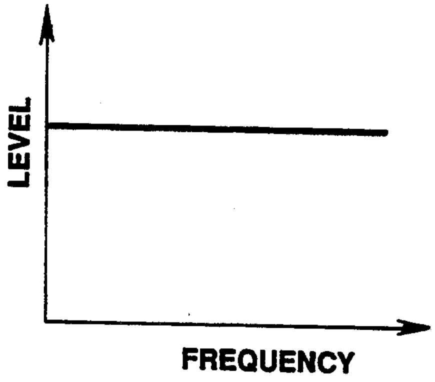
Figure 3:
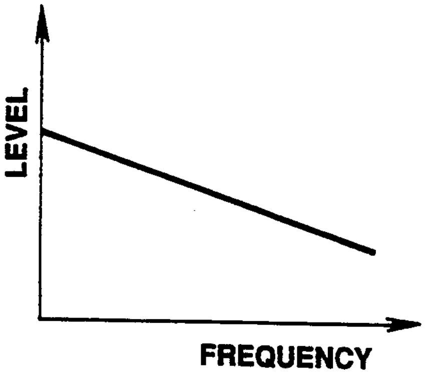

The identification signal generating section 41 may be arranged as including an M series signal generator 41*a*, and a low pass filter 41*b*, as shown in FIG. 3(*a*). The M series signal generator 41*a* generates white noises having a spectral distribution as shown in FIG. 3(*b*). As can be seen from FIG. 3(*b*), the M series signal generator 14*a* produces an output signal having the same level over the entire frequency range. FIG. 3(*c*) shows the spectral distribution of the signal outputted from the low pass filter 41*b*. As can be seen from FIG. 3(*c*), the low pass filter 41*b* produces an identification signal $x_0$ having a level attenuated to a greater degree as the frequency increases. Alternatively, the identification signal generating section 41 may be arranged as including a digital memory for storing the waveform as shown in FIG. 3(*c*). In this case, the identification signal generating section 41 produces the identification signal $x_0$ based upon the waveform stored in the digital memory.

Figure 4A:
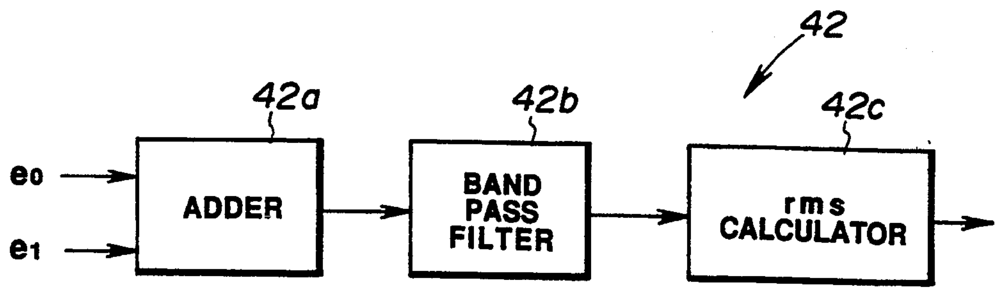
FIG. 4(*a*) is a block diagram showing the detailed arrangement of the road noise level detecting section.
Figure 4B:
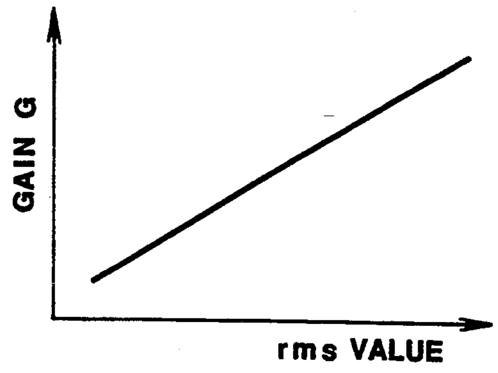
Figure 5:
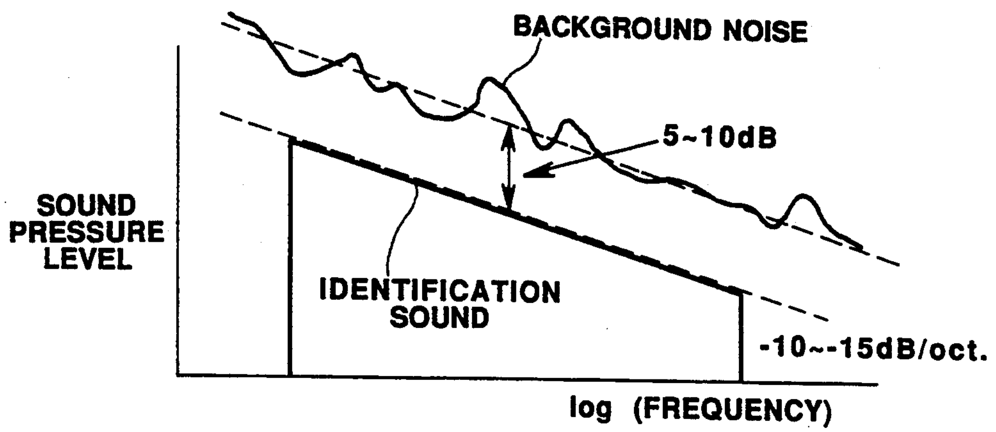
FIG. 5 is a graph of sound pressure versus frequency.

The background noise level detecting section 42 may be arranged as including an adder 42*a*, a band pass filter 42*b* and a root mean square (rms) calculator 42*c*. The adder 42*a* adds the residual noises $e_0$ and $e_1$ produced from the respective microphones $MP_0$ and $MP_1$. The added signal is fed from the adder to the band pass filter 42*b*. The band pass filter 42*b* removes the signal component at a frequency lower or higher than that of the identification signal $x_0$. This is effective to adjust the identification signal $x_0$ with higher accuracy. The filtered signal is fed from the band pass filter 42*b* to the rms calculator 42*c* which calculates the rms value of the filtered signal. The gain G, which is multiplied by the identification signal $x_0$ in the gain adjusting section 43, is determined based upon the output from the rms calculator 42*c*, as shown in FIG. 4(*b*). The gain G is determined in such a manner that the sound pressure level of the identification sound is a predetermined value is less than the sound pressure level of the background noise, as shown in FIG. 5. This predetermined value is in a range of 5 dB to 10 dB. The adaptive processing sections 44 and 45 update the filter coefficients of the filters $C_{00}''$, $C_{10}''$, $C_{01}''$ and $C_{11}''$ according to the LMS algorithm substantially in the same manner as made in the adaptive processing section 21 of the main control section 20. The detailed processes are disclosed, for example, in an article published 1985, by B. Windrow, S. D. Stearns entitled "Adaptive Signal Processing", Prentice-Hall, §9.

The operation of the active noise reduction apparatus of the invention will be described. The road noises produced between the road surface 2 and the road wheel 3 are transmitted into the vehicle passenger compartment 10. The reference signal x from the vibration sensor 4 is fed through an analog-to-digital converter (not shown) to the adaptive digital filters $W_0$ and $W_1$ and also to the filters $C_{00}'$, $C_{10}'$, $C_{01}'$ and $C_{11}'$. The adaptive digital filters $W_0$ and $W_1$ process the reference signal x to produce drive signal $y_0$ and $y_1$, respectively. The drive signals $y_0$ and $y_1$ are used to drive the loudspeakers $LS_0$ and $LS_1$ so as to produce control sounds in the vehicle passenger compartment 10. Just after the control is initiated, the filter coefficients of the adaptive digital filters $W_0$ and $W_1$ would not converge to value appropriate for minimizing the background noises in the vehicle passenger compartment 10. The reference signal x is fed to the filters $C_{00}'$, $C_{10}'$, $C_{01}'$ and $C_{11}'$ which produce respective values $r_{00}$, $r_{10}$, $r_{01}$ and $r_{11}$. The filter coefficient updating sections 22A and 22B receive the values $r_{00}$, $r_{10}$, $r_{01}$ and $r_{11}$ and also the residual noises $e_0$ and $e_1$ sensed in the vehicle passenger compartment 10 by the microphones $MP_0$ and $MP_1$ and they update the filter coefficients of the adaptive digital filters $W_0$ and $W_1$ according to Equation (5). As a result, the filter coefficients of the adaptive digital filters $W_0$ and $W_1$ converge at a rapid rate to the appropriate values. Consequently, the road noises transmitted into the vehicle passenger compartment 10 are canceled by the control noises produced from the loudspeakers $LS_0$ and $LS_1$.

Figure 6:
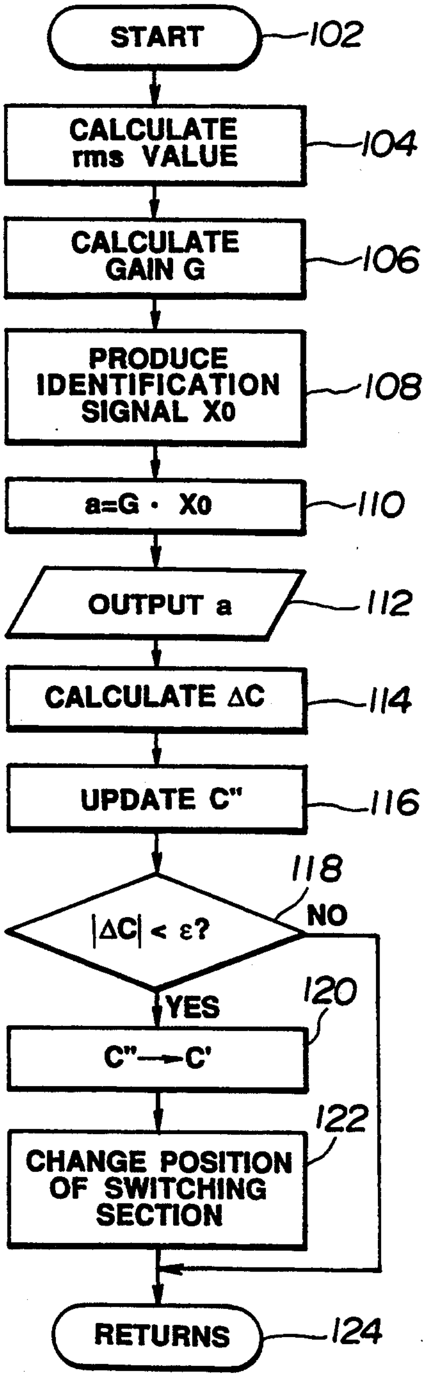
FIG. 6 is a flow chart used in explaining the identification process made in the identification processing section.

FIG. 6 is a flow chart showing the identification process made in the identification processing section 40. The identification process is started at the point 102. At the point 104, the adder 42*a* of the background noise level detecting section 42 adds the residual noises $e_0$ and $e_1$. The added signal is filtered by the band pass filter 42*b*. The rms calculator 42*c* calculates the rms values of the filtered signal. If the calculated rms value is sufficiently small, it means that the main control section 20 is operating in order to reduce the background noise to a sufficient extent and it is not required to perform the following process.

At the point 106, the gain adjusting section 43 calculates a gain G based upon the rms value calculated at the point 104 from a relationship stored in a memory. This relationship specifies the gain G as a function of rms value, as shown in FIG. 4(*b*). At the point 108, the identification signal generating section 41 produces an identification signal $x_0$ at the present time to the gain adjusting section 43. At the point 110, the gain adjusting section 43 adjusts the gain of the identification signal $x_0$ and calculates the identification signal $a(=G\cdot x_0)$. Upon completion of this calculation, at the point 112, the identification signal a is outputted through the switching section 50 to the adder 23 or 24. The identification signal a is superimposed on the drive signal $y_0$ or $y_1$ produced from the adaptive digital filter $W_0$ or $W_1$. The superimposed signal is used to drive the loudspeaker $LS_0$ or $LS_1$. As a result, the loudspeakers $LS_0$ and $LS_1$ produce control sounds resulting from the drive signals $y_0$ and $y_1$ and an identification sound resulting from the identification signal a in the vehicle passenger compartment 10. The sound pressure level of the identification sound is adjusted to a predetermined value ranging from 5 dB to 10 dB less than the background noise level through the gain control made in the gain adjusting section 43, as shown in FIG. 5. The spectral distribution of the identification sound is similar to that of the road noises which are the main components of the background noise. For this reason, the produced identification sound will cause such a very small sound pressure level increase that the passenger cannot hear it. For example, the sound pressure level will increase about 0.4 dB if the sound pressure level of the identification sound is 10 dB less than that of the road noises. The identification sound produced from the loudspeaker will cause a residual noise component superimposed on the residual noises $e_0$ and $e_1$ measured by the microphones $MP_0$ and $M_1$. Since the filter coefficient updating sections 22A and 22B receive the values $r_{00}$, $r_{10}$, $r_{01}$ and $r_{11}$ along with the residual noises $e_0$ and $e_1$, however, it is possible to prevent any deterioration of the noise control characteristics of the main control section 20 by performing appropriate operations according to Equation (5) in the filter coefficient updating sections 22A and 22B to update the filter coefficients of the adaptive digital filters $W_0$ and $W_1$ based upon the residual noise components related to the reference signal x.

Figure 7:
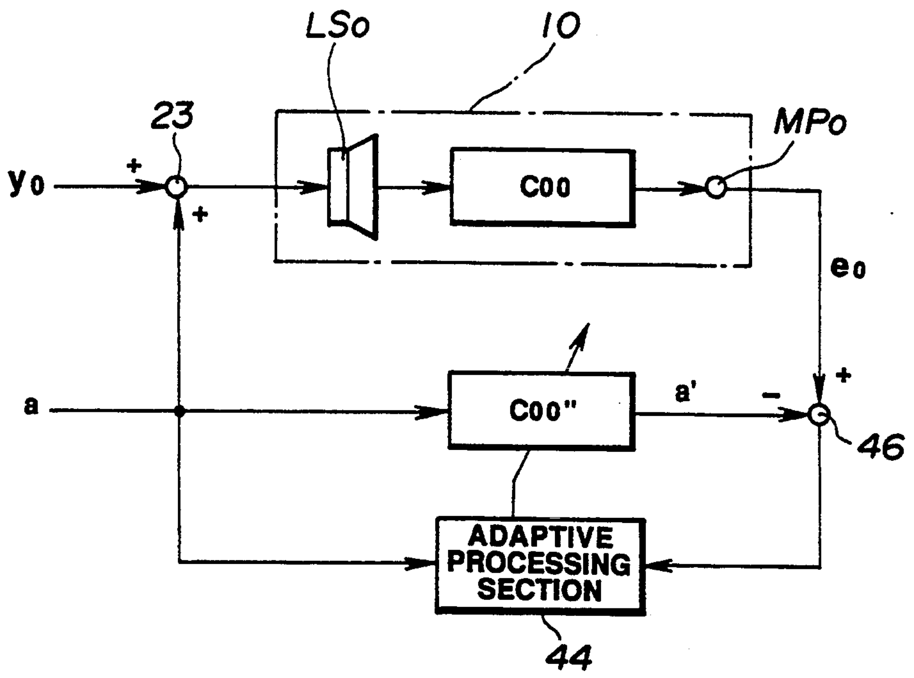
FIG. 7 is a schematic block diagram used in explaining the identification process made in the identification processing section.

At the point 114, the adaptive processing section 44 calculates a value $\Delta Ci(n)$ by which the i-th filter coefficient of the filter $C_{00}''$ is to be updated. When the loudspeaker $LS_0$ is driven by the drive signal $y_0$ on which the identification signal a is superimposed, it produces a sound including a component related to the identification signal a. The fact that the transfer function $C_{00}$ of the vehicle passenger compartment 10 (physical space) agrees with the filter $C_{00}''$ means that the component related to the identification signal a agrees with the value a' of the identification signal processed in the filter $C_{00}''$, as shown in FIG. 7. The residual noise $e_0$ includes a component related to the identification signal a. It is possible to extract this component by supplying the identification signal a to the adaptive processing section 44. Thus, the value $\Delta Ci(n)$ by which the filter coefficient is to be updated can be calculated based upon the identification signal a and the output of the subtractor 46 from Equation (6) as follows:

$$\Delta Ci(n)=\beta\cdot a(n)\cdot[e_0(n-i)-a'(n-i)] \qquad (6)$$

where $\beta$ is the convergence coefficient that takes part in the rate at which the filter converges in an optimum fashion and contributes to the stability of the optimum convergence of the filter, and n is the step number on the discrete time axis. It can be judged that the filter $C_{00}''$ converges to the transfer function $C_{00}$ when the value $\Delta Ci(n)$ for any i is almost zero. At the point 116, the filter $C_{00}''$ is updated according to the value $\Delta Ci(n)$. At the point 118, a determination is made as to whether or not the absolute value of the value $\Delta Ci(n)$ for any i is less than a predetermined value $\epsilon$. If the answer to this question is "yes", then it means that the filter $C_{00}''$ has converged to the transfer function $C_{00}$ and, at the point 120, the filter $C_{00}'$ is replaced with the filter $C_{00}''$. Otherwise, the adaptive process is advanced to the point 124. At the point 122, the position of the switching section 50 is changed. Following this, the adaptive process is advanced to the point 124 where it is returned to the point 104.

Similar processes are performing for the other filters $C_{10}''$, $C_{01}''$ and $C_{11}''$. The sound pressure level of the identification sound is much less than that of the background noise so that the passenger cannot hear the identification sound. For this reason, the residual noises $e_0$ and $e_1$ contain noise components greater than the components required for the identification process. However, it is possible to perform the identification process with no trouble by elongating the identification time, that is, by determining the convergence of the filter based upon the average of the past values $-\Delta Ci$ rather than the instant value $\Delta Ci$. Since the S/N ratio is improved according to $n^{\frac{1}{2}}$, the influence of the noise component can be reduced to 1/10 when the number of the averaged values is about 100.

According to the invention, the identification sound used for the identification process has such a small sound pressure that the passenger cannot hear it and it causes no noise control deterioration. It is, therefore, possible to execute the identification process always along with the noise control. Since deviations between the filters $C_{00}'$, $C_{10}'$, $C_{01}'$ and $C_{11}'$ and the transfer functions $C_{00}$, $C_{10}$, $C_{01}$ and $C_{11}$ can be minimized, it is possible to provide good noise control even though the acoustic transfer characteristics changes to a great extent in a short time in the vehicle passenger compartment. Since the identification signal a is superimposed on the drive signals $y_0$ and $y_1$ produced from the respective adaptive digital filters $W_0$ and $W_1$ for application to the loudspeakers $LS_0$ and $LS_1$, it is possible to provide complete agreement between the propagation path of the identification sound and the propagation path of the control sound. This is effective to provide accurate identification process.

The sound pressure level of the identification sound decreases as the gain G decreases. However, the S/N ratio is preferred to be as high as possible for the identification process so that a longer time is required for the identification process as the sound pressure level of the identification sound decreases. According to the invention, the background noise level is detected based upon the detected residual noises $e_0$ and $e_1$. Since the background noise level in the vehicle passenger compartment can be monitored directly, the gain G can be set at a value appropriate in setting the sound pressure level of the identification sound at a value that is a predetermined value ranging from 5 dB to 10 dB less than the sound pressure level of the background noise level. That is, the sound pressure level of the identification sound can be set at such a maximum possible value that the passenger cannot hear it. It is, therefore, possible to execute the identification process in a short time.

The adaptive processing sections 44 and 45 of the identification processing section 40, the filters $C_{00}''$, $C_{10}''$, $C_{01}''$ and $C_{11}''$, and the steps at the points 114 to 120 institute updating means. The adders 23 and 24, the identification signal generating section 41, the gain adjusting section 43, the adaptive processing sections 44 and 45, the subtractors 46 to 49, the switching section 50 and the loudspeakers $LS_0$ and $LS_1$ constitute the identification sound generating means.

Figure 8:
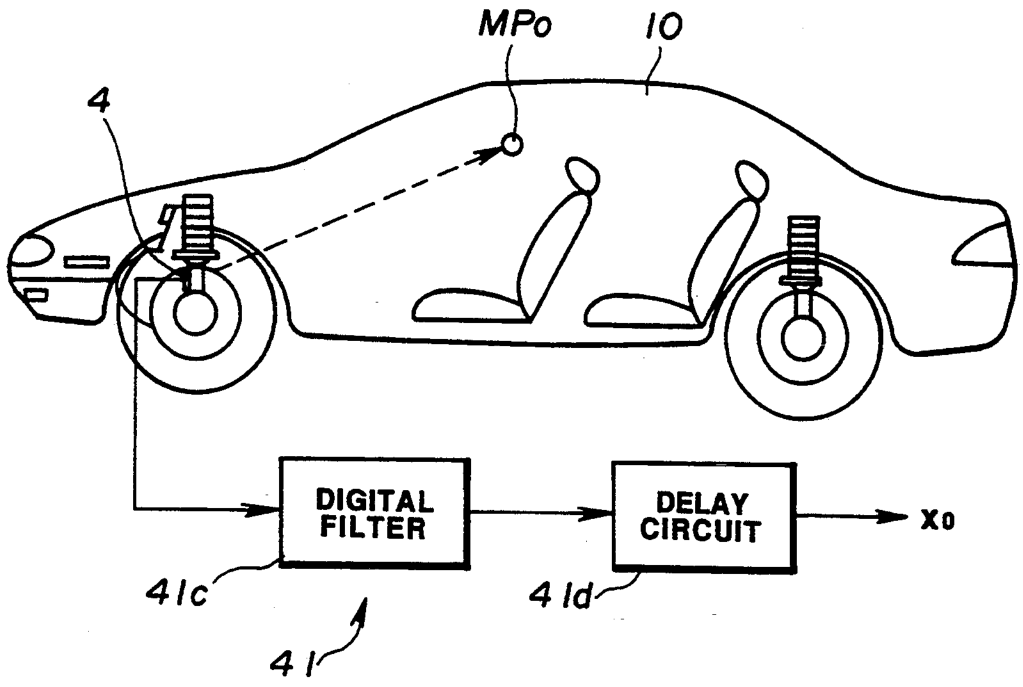
FIG. 8 is a schematic diagram showing a second embodiment of the active noise reduction apparatus of the invention.

Referring to FIG. 8, there is shown a second embodiment of the active noise reduction apparatus of the invention. This embodiment is substantially the same as the first embodiment except for the arrangement of the identification signal generating section 41. In this embodiment, the identification signal generating section 41 includes a digital filter 41*c*, and a delay circuit 41*d*. The digital filter 41*c* is in the form of a finite impulse response type filter having a transfer characteristic (sound pressure during vehicle running/vibration acceleration) obtained experimentally. The digital filter 41*c* receives an input from the vibration sensor 4 and it performs a process corresponding to the above mentioned transfer characteristic. The processed signal is fed from the digital filter 41*c* to the delay circuit 41 which delays it to form the identification signal $x_0$. This embodiment can eliminate the need for any source for generating the identification sound. Since the magnitude of the suspension vibration and the level of the road noise agree well with each other, it is possible to provide appropriate level adjustment. If there are provided signal detectors related to noise sources other than the vibration sensor 4, the outputs from these signal detectors can be introduced for the noise control. This is effective to provide an improved identification process without complicating the arrangement of the identification processing section 40. If the identification signal is taken in the form of the output of the vibration sensor 4, the control sounds and the identification sound produced from the loudspeakers $LS_0$ and $LS_1$ are correlated so that the noise control is degraded. This difficulty can be eliminated by providing the delay circuit in the front or rear stage of the digital filter 41*c*. Thus, the delay circuit 41*c* may have a delay, for example, 0.3 seconds between the time at which the output of the vibration sensor 4 is used for the noise control and the time at which the output of the vibration sensor 4 disappears.

Figure 9:
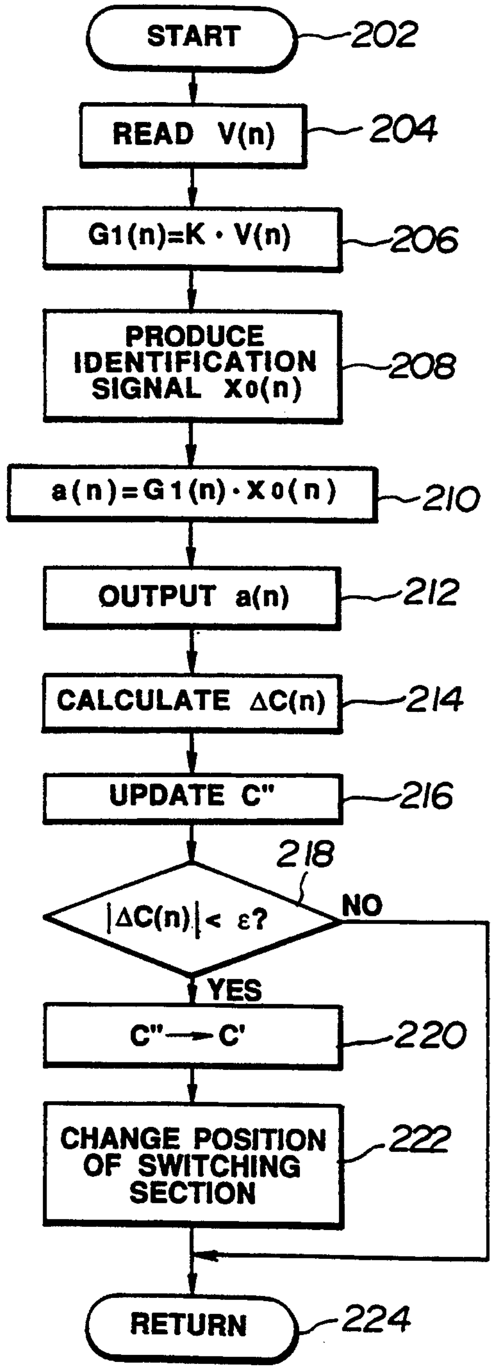
FIG. 9 is a flow chart used in explaining a modified form of the identification process made in the identification processing section.

Referring to FIG. 9, there is shown a modified form of the identification process performed in the identification processing section 40. The identification process is started at the point 202. At the point 204, the vehicle speed V(n) is read. The vehicle speed V(n) is indicated by a vehicle speed signal fed from vehicle speed detecting means in the form of a vehicle speed sensor associated with the vehicle transmission. At the point 206, the read vehicle speed V(n) is multiplied by a proportional constant k to calculate a gain $G_1(n)$. The level of the background noises, which are considered to include the road noise and the wind sound, is directly proportional to the vehicle speed within a certain speed range. The proportional relationship is obtained experimentally. Since proportional constant k is predetermined to obtain such a gain that the identification sound decreases a predetermined level based upon the proportional relationship, as shown in FIG. 5, an appropriate gain $G_1(n)$ can be obtained based upon the vehicle speed V(n). Alternatively, the proportional constant k may be determined based upon the fact that the road noise increases by 6 dB when the vehicle speed doubles.

At the point 208, the identification signal $x_0$ is produced. At the following point 210, the identification signal a(n) $(=G(n)\cdot x_0(n))$ is calculated. Upon completion of this calculation, at the point 212, the identification signal a(n) is outputted through the switching section 50 to the adder 23 or 24. The identification signal a(n) is superimposed on the drive signal $y_0$ or $y_1$ produced from the adaptive digital filter $W_0$ or $W_1$. The superimposed signal is used to drive the loudspeaker $LS_0$ or $LS_1$. As a result, the loudspeakers $LS_0$ and $LS_1$ produce control sounds resulting from the drive signals $y_0$ and $y_1$ and an identification sound resulting from the identification signal a in the vehicle passenger compartment 10. The sound pressure level of the identification sound is adjusted to a predetermined value ranging from 5 dB to 10 dB less than the background noise level through the gain control made in the gain adjusting section 43, as shown in FIG. 5. The spectral distribution of the identification sound is similar to that of the road noises. For this reason, the produced identification sound will cause such a very small sound pressure level increase that the passenger cannot hear it. The identification sound produced from the loudspeaker will cause a residual noise component superimposed on the residual noises $e_0$ and $e_1$ measured by the microphones $MP_0$ and $MP_1$. Since the filter coefficient updating sections 22A and 22B receives the values $r_{00}$, $r_{10}$, $r_{01}$ and $r_{11}$ along with the residual noises $e_0$ and $e_1$, however, it is possible to prevent any deterioration of the noise control characteristics of the main control section 20 by making appropriate operations according to Equation (5) in the filter coefficient updating sections 22A and 22B to update the filter coefficients of the adaptive digital filters $W_0$ and $W_1$ based upon the residual noise components related to the reference signal x.

At the point 214, the adaptive processing section 44 calculates a value $\Delta Ci(n)$ by which the i-th filter coefficient of the filter $C_{00}''$ is to be updated. When the loudspeaker $LS_0$ is driven by the drive signal $y_0$ on which the identification signal a is superimposed, it produces a sound including a component related to the identification signal a. The fact that the transfer function $C_{00}$ of the vehicle passenger compartment 10 (physical space) agrees with the filter $C_{00}''$ means that the component related to the identification signal a agrees with the value a' of the identification signal processed in the filter $C_{00}''$, as shown in FIG. 8. The residual noise $e_0$ includes a component related to the identification signal a. It is possible to extract this component by supplying the identification signal a to the adaptive processing section 44. Thus, the value $\Delta Ci(n)$ by which the filter coefficient is to be updated can be calculated based upon the identification signal a and the output of the subtractor 46 from Equation (6). At the point 216, the filter $C_{00}''$ is updated according to the value $\Delta Ci(n)$. At the point 218, a determination is made as to whether or not the absolute value of the value $\Delta Ci(n)$ for any i is less than a predetermined value $\epsilon$. If the answer to this question is "yes", then it means that the filter $C_{00}''$ has converged to the transfer function $C_{00}$ and, at the point 220, the filter $C_{00}'$ is replaced with the filter $C_{00}''$. Otherwise, the adaptive process is advanced to the point 224. At the point 222, the position of the switching section 50 is changed. Following this, the adaptive process is advanced to the point 224 where it is returned to the point 204.

This modification can simplify the calculations since there is no need for the step of calculating the rms value.

Figure 10:
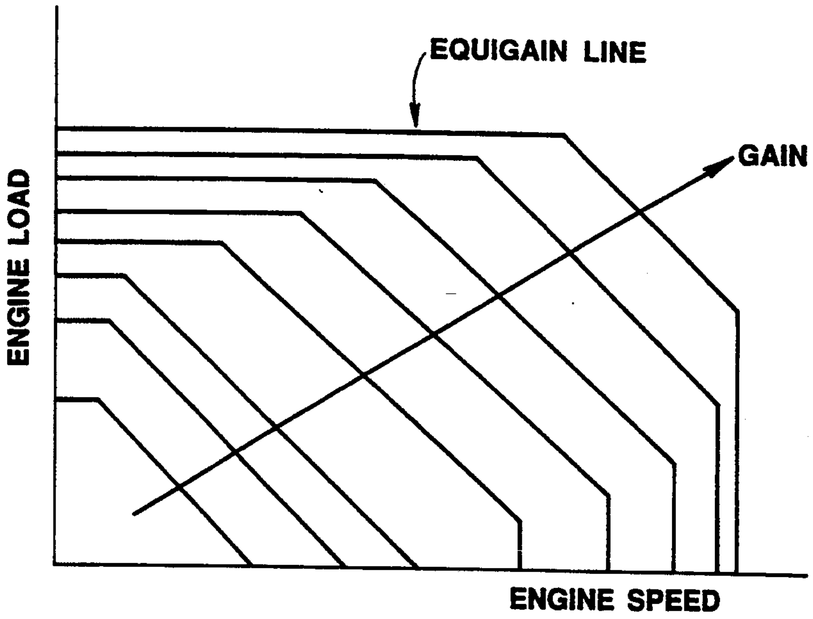
FIG. 10 is a graph of engine load versus engine speed.

If the background noise contains the noise transmitted from the engine into the vehicle passenger compartment, the gain, which is calculated at the point 106 of FIG. 6 or at the point 206 of FIG. 9, may be calculated with reference to a map stored in the identification processing section 40. FIG. 10 shows one example of such a map which specifies the gain as a function of engine speed and engine load.

Figure 11:
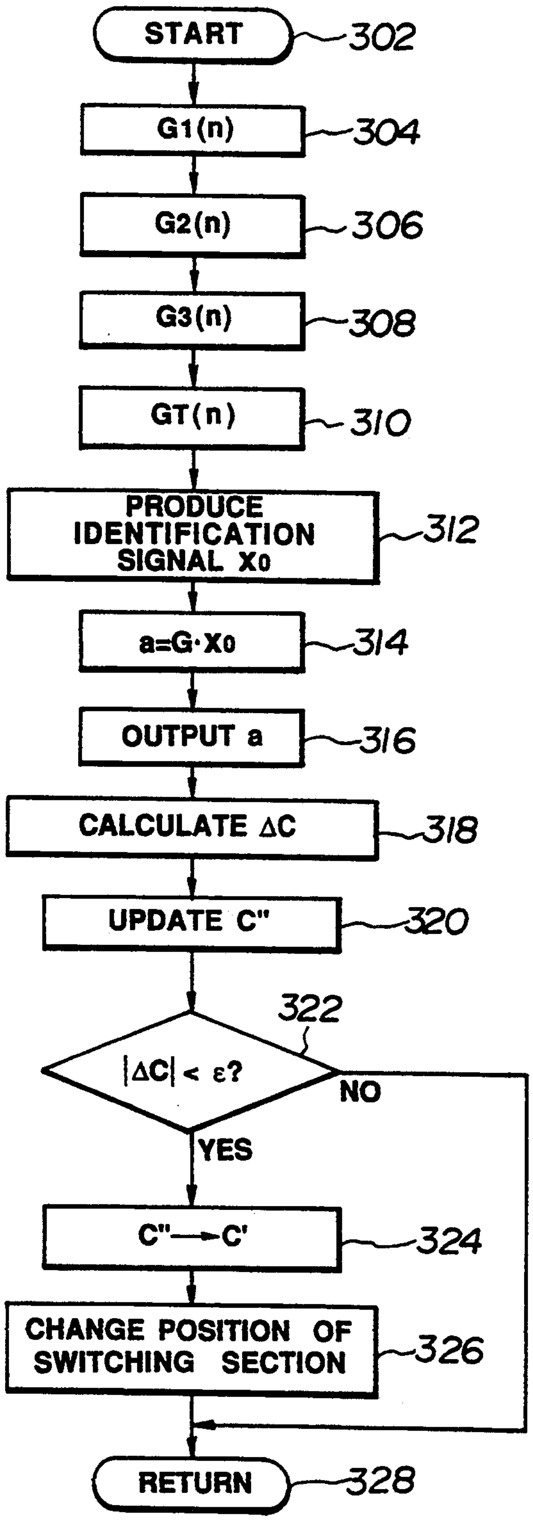
FIG. 11 is a flow chart used in explaining another modified form of the identification process made in the identification processing section.

Referring to FIG. 11, there is shown a modified form of the identification process made in the identification processing section 40. In this modification, the background noise contains a number of components transmitted into the vehicle passenger compartment. The identification process is started at the point 302. At the point 304, a gain $G_1(n)$ is calculated as a function of vehicle speed V(n). This calculation may be made as described in connection with the point 206 of FIG. 9. At the point 306, a gain $G_2(n)$ is calculated as a function of engine speed and engine load. This calculation may be made as described in connection with FIG. 10. At the point 308, a gain $G_3(n)$ is calculated based on a determination whether the audio unit is on or off. If the audio unit is one, the background noise level is considered to be great. At the point 310, the total gain $G_T(n)$ is calculated as:

$$G_T(n) = \left[ \sum_k G_k(n)^2 \right]^{\frac{1}{2}} \quad (7)$$

Alternatively, the total gain $G_T(n)$ may be calculated as:

$$G_T(n) = \sum_k G_k(n) \quad (8)$$

Since the total gain $G_T(n)$ would be too large with the use of Equation (8), it is possible to set an upper limit for each of the gains $G_k(n)$. The total gain $G_T(n)$ may be calculated as:

$$G_T(n) = \max[G_k(n)] \quad (9)$$

where the gain $G_T(n)$ is the maximum value of each of the gains $G_k(n)$. In this case, the gain $G_T(n)$ does not become too large.

At the point 312, the identification signal generating section 41 produces an identification signal $X_0$ at the present time to the gain adjusting section 43. At the point 314, the gain adjusting section 43 adjusts the gain of the identification signal $x_0$ and calculates the identification signal a ($=G \cdot x_0$). Upon completion of this calculation, at the point 316, the identification signal a is outputted through the switching section 50 to the adder 23 or 24. The identification signal a is superimposed on the drive signal $y_0$ or $y_1$ produced from the adaptive digital filter $W_0$ or $W_1$. The superimposed signal is used to drive the loudspeaker $LS_0$ or $LS_1$. As a result, the loudspeakers $LS_0$ and $LS_1$ produce control sounds resulting from the drive signals $y_0$ and $y_1$ and an identification sound resulting from the identification signal a in the vehicle passenger compartment 10. The sound pressure level of the identification sound is adjusted to a predetermined value ranging from 5 dB to 10 dB less than the background noise level through the gain control made in the gain adjusting section 43, as shown in FIG. 5. The spectral distribution of the identification sound is similar to that of the road noises which are the main components of the background noise. For this reason, the produced identification sound will cause such a very small sound pressure level increase that the passenger cannot hear it. The identification sound produced from the loudspeaker will cause a residual noise component superimposed on the residual noises $e_0$ and $e_1$ measured by the microphones $MP_0$ and $MP_1$. Since the filter coefficient updating sections 22A and 22B receives the values $r_{00}$, $r_{10}$, $r_{01}$ and $r_{11}$ along with the residual noises $e_0$ and $e_1$, however, it is possible to prevent any deterioration of the noise control characteristics of the main control section 20 by making appropriate operations according to Equation (5) in the filter coefficient updating sections 22A and 22B to update the filter coefficients of the adaptive digital filters $W_0$ and $W_1$ based upon the residual noise components related to the reference signal x.

At the point 318, the adaptive processing section 44 calculates a value $\Delta C(n)$ by which the filter coefficient of the filter $C_{00}''$ is to be updated. When the loudspeaker $LS_0$ is driven by the drive signal $y_0$ on which the identification signal a is superimposed, it produces a sound including a component related to the identification signal a. The fact that the transfer function $C_{00}$ of the vehicle passenger compartment 10 (physical space) agrees with the filter $C_{00}''$ means that the component related to the identification signal a agrees with the value a' of the identification signal processed in the filter $C_{00}''$, as shown in FIG. 7. The residual noise $e_0$ includes a component related to the identification signal a. It is possible to extract this component by supplying the identification signal a to the adaptive processing section 44. Thus, the value $\Delta Ci(n)$ by which the filter coefficient is to be updated can be calculated based upon the identification signal a and the output of the subtractor 46 from Equation (6). It can be judged that the filter $C_{00}''$ converges to the transfer function $C_{00}$ when the value $\Delta Ci(n)$ for any i is almost zero. At the point 320, the filter $C_{00}''$ is updated according to the value $\Delta Ci(n)$. At the point 322, a determination is made as to whether or not the absolute value of the value $\Delta Ci(n)$ for any i is less than a predetermined value $\epsilon$. If the answer to this question is "yes", then it means that the filter $C_{00}''$ has converged to the transfer function $C_{00}$ and, at the point 324, the filter $C_{00}'$ is replaced with the filter $C_{00}''$. Otherwise, the adaptive process is advanced to the point 328. At the point 326, the position of the switching section 50 is changed. Following this, the adaptive process is advanced to the point 328 where it is returned to the point 304.

In this embodiment, the gain $G_T(n)$ is calculated based upon the background noise level derived from various factors. Since the identification sound level can be set at a maximum possible value. It is possible to simplify the calculations required for the identification process and reduce the time required for the identification process. When the gain $G_T(n)$ is calculated from Equation (7), the gain can be set with higher accuracy so that the identification sound level to be set at a greater value and the time required for the identification process can be reduced. When the gain $G_T(n)$ is calculated from Equation (8) or (9), the calculations required for the identification process can be reduced.

Figure 12:
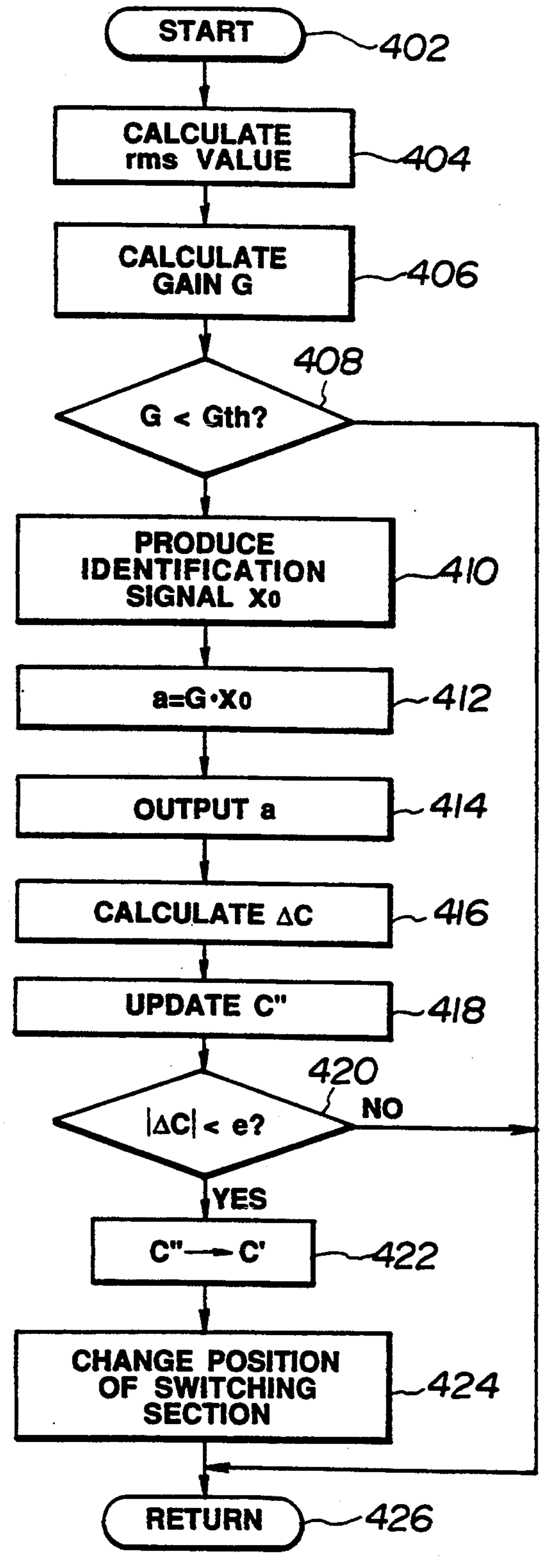
FIG. 12 is a flow chart used in explaining still another modified form of the identification process made in the identification processing section.

Referring to FIG. 12, there is shown another modified form of the identification process made in the identification processing section 40. The identification process is started at the point 402. At the point 404, the adder 42a of the background noise level detecting section 42 adds the residual noises $e_0$ and $e_1$. The added signal is filtered by the band pass filter 42b. The rms calculator 42c calculates the rms value of the filtered signal. If the calculated rms value is sufficiently small, it means that the main control section 20 is operating in order to reduce the background noise to a sufficient extent and it is not required to perform the following process.

At the point 406, the gain adjusting section 43 calculates a gain G based upon the rms value calculated at the point 404 from an relationship stored in a memory. This relationship specifies the gain G as a function of the rms value, as shown in FIG. 4(*b*). At the point 408, a determination is made as to whether or not the calculated gain G is less than a predetermined value $G_{th}$. If the answer to this question is "yes", then the process is advanced to the point 426. Otherwise, at the point 410, the identification signal generating section 41 produces an identification signal $x_0$ at the present time to the gain adjusting section 43. At the point 412, the gain adjusting section 43 adjusts the gain of the identification signal $x_0$ and calculates the identification signal a ($=G \cdot x_0$). Upon completion of this calculation, at the point 414, the identification signal a is outputted through the switching section 50 to the adder 23 or 24. The identification signal a is superimposed on the drive signal $y_0$ or $y_1$ produced from the adaptive digital filter $W_0$ or $W_1$. The superimposed signal is used to drive the loudspeaker $LS_0$ or $LS_1$. As a result, the loudspeakers $LS_0$ and $LS_1$ produce control sounds resulting from the drive signals $y_0$ and $y_1$ and an identification sound resulting from the identification signal a in the vehicle passenger compartment 10. The sound pressure level of the identification sound is adjusted to a predetermined value ranging from 5 dB to 10 dB less than the background noise level through the gain control made in the gain adjusting section 43, as shown in FIG. 5. The spectral distribution of the identification sound is similar to that of the road noises which are the main components of the background noise. For this reason, the produced identification sound will cause such a very small sound pressure level increase that the passenger cannot hear it. The identification sound produced from the loudspeaker will cause a residual noise component superimposed on the residual noises $e_0$ and $e_1$ measured by the microphones $MP_0$ and $MP_1$. Since the filter coefficient updating sections 22A and 22B receives the values $r_{00}$, $r_{10}$, $r_{01}$ and $r_{11}$ along with the residual noises $e_0$ and $e_1$, however, it is possible to prevent any deterioration of the noise control characteristics of the main control section 20 by making appropriate operations according to Equation (5) in the filter coefficient updating sections 22A and 22B to update the filter coefficients of the adaptive digital filters $W_0$ and $W_1$ based upon the residual noise components related to the reference signal x.

At the point 416, the adaptive processing section 44 calculates a value $\Delta Ci(n)$ by which the i-th filter coefficient of the filter $C_{00}''$ is to be updated. When the loudspeaker $LS_0$ is driven by the drive signal $y_0$ on which the identification signal a is superimposed, it produces a sound including a component related to the identification signal a. The fact that the transfer function $C_{00}$ of the vehicle passenger compartment 10 (physical space) agrees with the filter $C_{00}''$ means that the component related to the identification signal a agrees with the value a' of the identification signal processed in the filter $C_{00}''$, as shown in FIG. 7. The residual noise $e_0$ includes a component related to the identification signal a. It is possible to extract this component by supplying the identification signal a to the adaptive processing section 44. Thus, the value $\Delta C(n)$ by which the filter coefficient is to be updated can be calculated based upon the identification signal a and the output of the subtractor 46 from Equation (6). It can be judged that the filter $C_{00}''$ converges to the transfer function $C_{00}$ when the value $\Delta Ci(n)$ is almost zero. At the point 418, the filter $C_{00}''$ is updated according to the value $\Delta Ci(n)$. At the point 420, a determination is made as to whether or not the absolute value of the value $\Delta Ci(n)$ for any i is less than a predetermined value $\epsilon$. If the answer to this question is "yes", then it means that the filter $C_{00}''$ has converged to the transfer function $C_{00}$ and, at the point 422, the filter $C_{00}'$ is replaced with the filter $C_{00}''$. Otherwise, the adaptive process is advanced to the point 426. At the point 424, the position of the switching section 50 is changed. Following this, the adaptive process is advanced to the point 426 where it is returned to the point 404.

Similar processes are made for the other filters $C_{10}''$, $C_{01}''$ and $C_{11}''$. Since the background noise level varies in a dynamic range higher than 40 or 50 or dB, the A/D converter and the identification signal generating section connected to the microphones are required to have a great dynamic range. This results in an expensive apparatus. According to this embodiment, the identification process is inhibited when the gain G is small. This permits the use of components having a small dynamic range, resulting in an inexpensive apparatus.

Since the noise control cannot eliminate the noises completely, the background noise level may be detected based upon the level of the control sounds produced from the loudspeakers $LS_0$ and $LS_1$. In this case, a relationship between the residual noise level and the control sound level is stored in a memory. The background noise level is estimated from this relationship. The gains of the adaptive digital filters $W_0$ and $W_1$ may be estimated from their filter coefficients. Alternatively, the gains may be estimated from the drive signals $y_0$ and $y_1$ produced from the adaptive digital filters $W_0$ and $W_1$.

Although the invention has been described in connection with reduction of road noses transmitted into a vehicle passenger compartment 10, it is to be noted that the invention is not limited in any way to this application. For example, the invention is applicable to reduce the noises transmitted from the engine into a vehicle passenger compartment. In this case, the reference signal is produced based upon the engine crankshaft position signal. Furthermore, the invention is also applicable to reduce noises transmitted into a closed space.

Although the invention has been described in connection with the switching section 50 for selecting the component(s) to which a single identification signal a is fed, it is to be noted that the switching section 50 may be removed. In this case, different identification signals are produced for the respective loudspeakers $LS_0$ and $LS_1$. Although the invention has been described in connection with two microphones $MP_0$ and $MP_1$ and two loudspeakers $LS_0$ and $LS_1$, it is to be noted that the number of the microphones and the loudspeakers may be three or more. If the acoustic transfer characteristic changes at a small rate, the sound pressure level of the identification sound may be set at a value 10 dB or more less than the sound pressure level of the background noise. Although the identification sound is produced based upon an identification signal $x_0$ exhibiting a spectral distribution similar to the spectral distribution of the noises in the vehicle passenger compartment, it is to be noted that the white noise may be applied as the identification signal $x_0$.

What is claimed is:

1. An apparatus for active reduction of noises transmitted from at least one noise source into a closed space for at least one human occupant, comprising:
- control sound sources for producing control sounds in the closed space;
- residual noise detecting means for detecting residual noises at predetermined positions in the closed space;
- noise generator condition detecting means for detecting a noise generating condition of the at least one noise source to generate a reference signal;
- signal processing means for filtering the reference signal corresponding to acoustic transfer characteristics between the control sound sources and the residual noise detecting means;
- active control means for driving the control sound sources according to an output filtered signal of said signal processing means to reduce the noises in the closed space based upon the reference signal and the residual noises;
- background noise level detecting means for detecting a background noise level in the closed space;
- identification sound generating means for producing an identification sound having a spectral distribution corresponding to a spectral distribution of the noise transmitted into the closed space from the at least one noise source, and for varying a sound pressure level of the identification sound according to the detected background noise level so that the identification sound cannot be heard by an occupant of the closed space due to a masking phenomenon and for enabling a rapid identification operation using the identification sound;
- means for deriving acoustic transfer characteristics between the control sound sources and the residual noise detecting means based upon the identification operation using the identification sound; and
- updating means for updating coefficients of a filter of said signal processing means based upon said derived acoustic transfer characteristics.

2. The active noise reduction apparatus as claimed in claim 1, wherein the active control means includes signal generating means for generating drive signal to drive the control sound sources based upon the reference signal, said updating means adjusting the coefficients of the filter of the signal generating means based upon a value resulting from the reference signal processed in the signal processing means and the residual noises to reduce the noises in the space.

3. The active noise reduction apparatus as claimed in claim 2, wherein the identification sound generating means includes means for generating said identification sound at a predetermined level less than the background noise level.

4. The active noise reduction apparatus as claimed in claim 3, wherein the predetermined level is in a range of 5 dB to 10 dB.

5. The active noise reduction apparatus as claimed in claim 1, wherein the identification sound generating means includes means for generating said identification sound at a predetermined level less than the background noise level.

6. The active noise reduction apparatus as claimed in claim 5, wherein the predetermined level is in a range of 5 dB to 10 dB.

7. The active noise reduction apparatus as claimed in claim 1, wherein the background noise level detecting means includes means for detecting the background noise level based upon the residual noises detected by the residual noise detecting means.

8. The active noise reduction apparatus as claimed in claim 1, wherein the identification sound generating means includes means for sequentially generating the identification sound and wherein the updating means including means for sequentially updating the coefficient of the filter of the signal processing means.

9. The active noise reduction apparatus as claimed in claim 1, wherein the identification sound generating means includes means for intermittently generating the identification sound and wherein the updating means including means for intermittently updating the coefficients of the filter of the signal processing means.

10. An apparatus for active reduction of noises transmitted from at least one noise source into a closed space as set forth in claim 1, wherein said identification sound generating means comprises:
- M series sequence signal generating means for generating an M series sequences signal constituting a white noise;
- a low pass filter for filtering the M series sequence signal and for outputting a filtered M series sequence signal $X_0$ representative thereof; and
- gain adjusting means for adjusting a gain (G) of the low-ass filtered M series sequence signal according to the background noise level detected by said background noise level detecting means to produce a gain adjusted filtered M series sequence signal ($G X_0$), so that the sound pressure level of the identification sound based on the signal ($G X_0$) is lower than a sound pressure level of the background noise by a range from about 5 dB to about 10 dB.

11. An apparatus for active reduction of noises transmitted from at least one noise source into a closed space as set forth in claim 10, wherein said residual noise detecting means comprises a plurality of microphones;
- said background noise level detecting means comprises:
  - an adder structured for adding each of the residual noises ($e_0$, $e_1$) received by an l-th microphone of said residual noise detecting means to produce added residual noises, where l is an ordinal integer;
  - a band pass filter (42*b*) connected to said adder to filter the added residual noises in an appropriate frequency band; and
  - an rms calculator (42*c*) structured for calculating a root means square value of the added residual noises passed through the band pass filter,
  - the rms calculator being connected to the gain adjusting means so that, as the root mean square value calculated by the rms calculator is increased, the gain of the gain adjusted low-pass filtered M series sequence signal is increased.

12. An apparatus for active reduction of noises transmitted from at least one noise source into a closed space as set forth in claim 11, further including a summing junction (23 or 24) in said active control means for superimposing the gain adjusted low-pass filtered M series sequence signal on a drive signal ($y_0$, $y_1$) supplied to an l-th loud speaker ($LS_0$, $LS_1$).

13. An apparatus for active reduction of noises transmitted from at least one noise source into a closed space as set forth in claim 12, wherein said means for deriving comprises an adaptive filter processing section for updating filter coefficients of the acoustic transfer characteristics by an updating quantity $\Delta C(n)$ for each of the acoustic transfer characteristics ($C_{00}''$, $C_{10}''$, $C_{01}''$, $C_{11}''$) between a 0th and a 1st loud speaker ($LS_0$ $LS_1$) and a 0th and a 1st microphone ($MP_0$, $MP_1$), the updating quantity $\Delta C(n)$ being calculated as follows:

$$\Delta C(n) = \beta \cdot a(n) \cdot \{e_0(n) - a'(n)\},$$

wherein a(n) denotes the M series sequence signal in a residual noise signal outputted by an m-th microphone ($MP_0$, $MP_1$) at a sampling time of n, where m is an ordinal integer and n is a real number, $e_0(n)$ denotes the residual noise signal outputted by the m-th microphone ($MP_0$) at the sampling time of n, a'(n) denotes an identification sound signal processed by an acoustic transfer function filter representative of the acoustic transfer characteristics ($C_{00}''$, $C_{10}''$, $C_{01}''$, or $C_{11}''$), and $\beta$ denotes a convergence coefficient.

14. An apparatus for active reduction of noises transmitted from at least one noise source into a closed space as set forth in claim 13, wherein the adaptive filter processing section operates to determine whether or not $\Delta C(n)$ indicates zero or near to zero, and, when $\Delta C(n)$ indicates zero or near to zero, the acoustic transfer function filter is determined to be converged to a previously derived acoustic transfer function ($C_{00}$, $C_{10}$, $C_{01}$, or $C_{11}$), and the adaptive filter processing section updates acoustic transfer function filter coefficients ($C_{00}'$, $C_{10}'$, $C_{01}'$, or $C_{11}'$) by $\Delta C(n)$, and wherein when $\Delta C(n)$ does not indicate zero or near to zero, the adaptive filter processing section determines whether $|\Delta C(n)|$ is smaller than a predetermined value $\epsilon$ and when $|\Delta C(n)|$ is smaller than the predetermined value, the adaptive filter processing section replaces the acoustic transfer function filter coefficients ($C_{00}'$, $C_{10}'$, $C_{01}'$, or $C_{11}'$) by ($C_{00}'$, $C_{10}'$, $C_{01}'$, or $C_{11}'$).

15. An apparatus for active reduction of noises transmitted from at least one noise source into a closed space as set forth in claim 14, wherein said signal processing means comprises an LMS adaptive filter having filter coefficients denoted by $W_{mi}$ which is updated as follows:

$$W_{mi}(n+1) = W_{mi}(n) + \alpha \sum_{j=0}^{L} \gamma_1 c_1(n) r_{lm}(n-i),$$

wherein $r_{lm}(m-i)$ denotes $$\sum_{j=0}^{Ic-1} C_{lmj} x(n-j-1),$$

wherein $\alpha$ denotes a convergence coefficient, $\gamma_l$ denotes a weight coefficient, l denotes a l-th microphone, (l=0, 1, . . . , L), $C_{lmj}$ denotes a j-th filter coefficient (j=0, 1, . . . , Ic−1) of the acoustic transfer characteristic $C_{lm}$ between the m-th microphone and the l-th loud speaker of a filter modeled in a form of a finite impulse response function, wherein the output signal of the LMS adaptive filter $y_m(n)$ is expressed as follows:

$$y_m(n) = \sum_{i=0}^{Ik-1} W_{mi} x(n-j-1)$$

and wherein the l-th microphone receives and introduces a residual noise signal $e_l(n)$ expressed as follows:

$$e_1(n) = ep_1(n) + \sum_{m=0}^{M} \sum_{j=0}^{Ic-1} C_{lmj} \left\{ \sum_{I=0}^{Ik-1} W_{mi} x(n-j-1) \right\}.$$

wherein $ep_1(n)$ denotes the residual noise signal when no control sound is output from the l-th loud speaker.

16. An apparatus for active reduction of noises transmitted from a noise source into a closed space into which a human kind can enter, comprising:

control sound sources for producing in the closed space control sounds having a phase opposite to a phase of the noises transmitted from the noise source;

residual noise detecting means for detecting residual noises at predetermined positions in the closed space and for generating a residual noise signal representative thereof;

noise generator condition detecting means for detecting a noise generating condition of the noise source to generate a reference signal;

signal generating means for generating signals to drive the control sound sources based upon the reference signal;

signal processing means for filtering the reference signal corresponding to acoustic transfer characteristics between the control sound sources and the residual noise detecting means;

control means for adjusting characteristics of the signal generating means based upon a value resulting from the reference signal processed in the signal processing means to reduce the noises in the closed space;

identification signal generating means for generating an identification signal having a spectral distribution corresponding to a spectral distribution of the noise transmitted from the noise source;

background noise level detecting means for detecting a background noise level in the closed space;

gain adjusting means for adjusting a gain of the identification signal based upon the detected background noise level;

signal superimposing means for superimposing the identification signal having the adjusted gain on the drive signals generated by the signal generating means to produce signals for the control sound sources;

means for obtaining acoustic transfer characteristics between the control sound sources and the residual noise detecting means based upon the identification signal having the adjusted gain and on the residual noises in the closed space when the control sound sources are driven by the signals produced by the signal superimposing means;

first updating means for updating adaptive digital filter coefficients of the signal processing means based upon the residual noises in the closed space; and, second updating means for updating acoustic transfer characteristic coefficients based upon the identification signal superimposed on the residual noises in the closed space, wherein said adjusting means includes means for adjusting the gain of the identification signal so that the identification sound produced when the control sound sources are driven by the identification signal has a predetermined level less than the background noise level.

17. An apparatus for active reduction of noises transmitted from at least one noise source into a closed space, comprising:

control sound sources for producing control sounds in the closed space;

residual noise detecting means for detecting residual noises at predetermined positions in the closed space and for generating a residual noise signal representative thereof;

noise generator condition detecting means for detecting a noise generating condition of the noise source to generate a reference signal;

signal generating means for generating drive signals to drive the control sound sources based upon the reference signal;

signal processing means for filtering the reference signal corresponding to acoustic transfer characteristics between the control sound sources and the residual noise detecting means;

control means for adjusting characteristics of the signal generating means based upon a value resulting from the reference signal processed in the signal processing means to reduce the noises in the closed space;

identification signal generating means for generating an identification signal having a spectral distribution corresponding to a spectral distribution of the noises transmitted from the noise source;

background noise level detecting means for detecting a background noise level in the closed space;

gain adjusting means for adjusting a gain of the identification signal based upon the detected background noise level for varying a sound pressure level thereof so that a sound corresponding to the identification signal cannot be heard by an occupant of the closed space;

signal superimposing means for superimposing the identification signal having the adjusted gain on the drive signals generated by the signal generating means to produce signals for the control sound sources;

means for deriving acoustic transfer characteristics between the control sound sources and the residual noise detecting means based upon the identification operation using the identification signal having the adjusted gain; and updating means for updating coefficients of a filter of the signal processing means based on the derived acoustic transfer characteristics and on the residual noise signal when the control sound sources are driven by the signals produced from the signal superimposing means.

18. The active noise reduction apparatus as claimed in claim 17, wherein the background noise level detecting means includes means for detecting the background noise level based upon the residual noised detected by the residual noise detecting means.

19. The active noise reduction apparatus as claimed in claim 17, wherein the identification sound generating means includes means for continuously generating the identification sound and wherein the updating means including means for continuously updating the content of the signal process of the signal processing means.

20. The active noise reduction apparatus as claimed in claim 17, wherein the identification sound generating means includes means for intermittently generating the identification sound and wherein the updating means including means for intermittently updating the coefficients of the filter of the signal processing means.

21. An apparatus for active reduction of noises transmitted from a noise source into a closed space, comprising:

control sound sources for producing control sounds in the closed space;

residual noise detecting means for detecting residual noises at predetermined positions in the closed space and for generating a residual noise signal representative thereof;

noise generator condition detecting means for detecting a noise generating condition of the noise source to generate a reference signal;

signal generating means for generating drive signals to drive the control sound sources based upon the reference signal;

signal processing means for filtering the reference signal corresponding to acoustic transfer characteristics between the control sound sources and the residual noise detecting means;

control means for adjusting characteristics of the signal generating means based upon a value resulting from the reference signal processed in the signal processing means to reduce the noises in the closed space;

identification signal generating means for generating an identification signal having a spectral distribution corresponding to a spectral distribution of the noises transmitted into the closes space from the noise source;

background noise level detecting means for detecting a background noise level in the closed space;

gain adjusting means for adjusting a gain of the identification signal based upon the detected background noise level;

signal superimposing means for superimposing the identification signal having the adjusted gain on the drive signals generated by the signal generating means to produce signals for the control sound sources;

means for deriving acoustic transfer characteristics between the control sound sources and the residual noise detecting means based upon the identification signal having the adjusted gain; and updating means for updating coefficients of a filter of the signal processing means based on the derived acoustic transfer characteristics and on the residual noise signal when the control sound sources are driven by the signals produced from the signal superimposing means, wherein the gain adjusting means includes means for adjusting the gain of the identification signal so that the identification sound produced when a control sound source is driven by the identification signal has a predetermined level less than the background noise level.

22. The active noise reduction apparatus as claimed in claim 21, wherein the predetermined level is in a range of 5 dB to 10 dB.

23. The active noise reduction apparatus as claimed in claim 21, wherein said signal generating means operates for driving the control sound sources to produce control sounds opposite in phase to the noise transmitted from the noise source into the closed space.

24. The active noise reduction apparatus as claimed in claim 21, wherein said signal superimposing means comprises means for superimposing the identification signal having the adjusted gain only on a drive signal for a control sound source not used for updating the coefficients of the filter of the signal processing means.

25. An apparatus for active reduction of noises transmitted from at least one noise source into a vehicle passenger compartment, comprising:

- control sound sources for producing control sounds in the vehicle passenger compartment;
- residual noise detecting means for detecting residual noises at predetermined positions in the vehicle passenger compartment;
- noise generator condition detecting means for detecting a noise generating condition of the at least one noise source to generate a reference signal;
- signal processing means for filtering the reference signal corresponding to acoustic transfer characteristics between the control sound sources and the residual noise detecting means;
- active control means for driving the control sound sources according to an output filtered signal of said signal processing means to reduce the noises in the vehicle passenger compartment based upon the reference signal and the residual noises;
- background noise level detecting means for detecting a background noise level in the vehicle passenger compartment;
- identification sound generating means for producing an identification sound having a spectral distribution corresponding to a spectral distribution of the noises transmitted into the vehicle passenger compartment from the at least one noise source, and for varying a sound pressure level of the identification sound according to the detected background noise level so that the identification sound cannot be heard by an occupant of the vehicle passenger compartment due to a masking phenomenon and for enabling a rapid identification operation using the identification sound;
- means for deriving acoustic transfer characteristics between the control sound sources and the residual noise detecting means based upon the identification operation using the identification sound; and
- updating means for updating coefficients of a filter of said signal processing means based upon said derived acoustic transfer characteristics.

26. The active noise reduction apparatus as claimed in claim 25, wherein the active control means includes signal generating means for generating drive signals to drive the control sound sources based upon the reference signal, signal processing means for filtering the reference signal corresponding to acoustic transfer characteristics between the control sound sources and the residual noise detecting means, and control means for adjusting a content of the signal process of the signal generating means based upon a value resulting from the reference signal processed in the signal processing means and the residual noises to reduce the noises in the vehicle passenger compartment.

27. The active noise reduction apparatus as claimed in claim 26, wherein the identification sound generating means includes means for generating an identification sound at a predetermined level less than the background noise level.

28. The active noise reduction apparatus as claimed in claim 27, wherein the predetermined level is in a range of 5 dB to 10 dB.

29. The active noise reduction apparatus as claimed in claim 25, wherein the identification sound generating means includes means for generating an identification sound at a predetermined level less than the background noise level.

30. The active noise reduction apparatus as claimed in claim 29, wherein the predetermined level is in a range of 5 dB to 10 dB.

31. The active noise reduction apparatus as claimed in claim 25, wherein the background noise level detecting means includes means for detecting the background noise level based upon the residual noises detected by the residual noise detecting means.

32. The active noise reduction apparatus as claimed in claim 25, wherein the identification sound generating means includes means for sequentially generating the identification sound and wherein the updating means including means for sequentially updating the coefficients of the filter of the signal processing means.

33. The active noise reduction apparatus as claimed in claim 25, wherein the identification sound generating means includes means for intermittently generating the identification sound and wherein the updating means including means for intermittently updating the coefficients of the filter of the signal processing means.

34. The active noise reduction apparatus as claimed in claim 25, further including at least one of vehicle speed detecting means for detecting a vehicle speed, engine speed detecting means for detecting an engine speed, engine load detecting means for detecting an engine load and audio generating condition detecting means for detecting an audio generating condition, and wherein the background noise level detecting means includes means for detecting the background noise level based upon at least one of the detected vehicle speed, detected engine speed, detected engine load and detected audio generating condition.

35. An apparatus for active reduction of noises transmitted from at least one noise source into a vehicle passenger compartment, comprising:

- control sound sources for producing control sounds in the vehicle passenger compartment;
- residual noise detecting means for detecting residual noises at predetermined positions in the vehicle passenger compartment;
- noise generator condition detecting means for detecting a noise generating condition of the at least one noise source to generate a reference signal;
- signal generating means for generating drive signals to drive the control sound sources based upon the reference signal;
- signal processing means for filtering the reference signal corresponding to acoustic transfer characteristics between the control sound sources and the residual noise detecting means;
- control means for adjusting characteristics of the signal generating means based upon a value resulting from the reference signal processed in the signal processing means to reduce the noises in the vehicle passenger compartment;
- identification signal generating means for generating an identification signal having a spectral distribution corresponding to a spectral distribution of the noises transmitted into the vehicle passenger compartment from the at least one noise source;

background noise level detecting means for detecting a background noise level in the vehicle passenger compartment;

gain adjusting means for adjusting a gain of the identification signal based upon the detected background noise level for varying a sound pressure level thereof so that a sound corresponding to the identification signal cannot be heard by an occupant of the vehicle passenger compartment;

signal superimposing means for superimposing the identification signal having the adjusted gain on the drive signals generated by the signal generating means to produce signals for the control sound sources;

means for deriving acoustic transfer characteristics between the control sound sources and the residual noise detecting means based upon the identification operation using the identification signal having the adjusted gain; and updating means for updating coefficients of a filter of the signal processing means based on the derived acoustic transfer characteristics and on the residual noises in the vehicle passenger compartment when the control sound sources are driven by the signals produced from the signal superimposing means.

36. The active noise reduction apparatus as claimed in claim 35, wherein the gain adjusting means includes means for adjusting the gain of the identification signal so that the identification sound produced when the control sound source is driven by the identification signal has a predetermined level less than the background noise level.

37. The active noise reduction apparatus as claimed in claim 36, wherein the predetermined level is in a range of 5 dB to 10 dB.

38. The active noise reduction apparatus as claimed in claim 35, wherein the background noise level detecting means includes means for detecting the background noise level based upon the residual noises detected by the residual noise detecting means.

39. The active noise reduction apparatus as claimed in claim 35, wherein the identification sound generating means includes means for sequentially generating the identification sound and wherein the updating means including means for sequentially updating the coefficients of the filter of the signal processing means.

40. The active noise reduction apparatus as claimed in claim 35, wherein the identification sound generating means includes means for intermittently generating the identification sound and wherein the updating means including means for intermittently updating the coefficients of the filter of the signal processing means.

41. The active noise reduction apparatus as claimed in claim 35, further including at least one of vehicle speed detecting means for detecting a vehicle speed, engine speed detecting means for detecting an engine speed, engine load detecting means for detecting an engine load and audio generating condition detecting means for detecting an audio generating condition, and wherein the background noise level detecting means includes means for detecting the background noise level based upon at least one of the detected vehicle speed, detected engine speed, detected engine load and detected audio generating condition.

42. An apparatus for active reduction of noises transmitted from sources of road noise between vehicle roadwheels and a road surface into a vehicle passenger compartment, comprising:

control sound sources for producing control sounds in the vehicle passenger compartment;

residual noise detecting means for detecting residual noises at predetermined positions in the vehicle passenger compartment;

noise generator condition detecting means for detecting a noise generating condition of the sources of road noise to generate a reference signal;

signal generating means for generating drive signals to drive the control sound sources based upon the reference signal;

signal processing means for filtering the reference signal corresponding to acoustic transfer characteristics between the control sound sources and the residual noise detecting means;

control means for adjusting characteristics of the signal generating means based upon a value resulting from the reference signal processed in the signal processing means to reduce the noises in the vehicle passenger compartment;

identification signal generating means for generating an identification signal having a spectral distribution corresponding to spectral distributions of the road noises;

background noise level detecting means for detecting a background noise level in the vehicle passenger compartment;

gain adjusting means for adjusting a gain of the identification signal based upon the detected background noise level;

signal superimposing means for superimposing the identification signal having the adjusted gain on the drive signals generated by the signal generating means to produce signals for the control sound source;

deriving means for obtaining acoustic transfer characteristics between the control sound sources and the residual noise detecting means based upon the identification signal having the adjusted gain and on the residual noises in the closed space when the control sound sources are driven by the signals produced by the signal superimposing means;

first updating means for updating adaptive digital filter coefficients of the signal processing means based upon the residual noises in the closed space; and second updating means for updating acoustic transfer characteristic coefficients based upon the identification signal superimposed on the residual noises, wherein said gain adjusting means includes means for adjusting the gain of the identification signal so that the identification sound produced when the control sound sources are driven by the identification signal which has a predetermined level less than the background noise level.

* * * * *

UNITED STATES PATENT AND TRADEMARK OFFICE

CERTIFICATE OF CORRECTION

PATENT NO. : 5,384,853

DATED : January 24, 1995

INVENTOR(S) : Akio KINOSHITA et al

It is certified that error appears in the above-indentified patent and that said Letters Patent is hereby corrected as shown below:

On the title page, please delete item [75] and replace it with the following:

--[75] Inventors: Akio Kinoshita, Fujisawa; Kazuhiro Doi; Kenichiro Muraoka, both of Yokohama; Tsutomu Hamabe, Yokosuka, all of Japan--

Signed and Sealed this

Twenty-fifth Day of April, 1995

*Attest:*

BRUCE LEHMAN

*Attesting Officer*

*Commissioner of Patents and Trademarks*